United States Patent
Chen et al.

(10) Patent No.: US 9,093,130 B2
(45) Date of Patent: *Jul. 28, 2015

(54) SENSE AMPLIFIER WITH SHIELDING CIRCUIT

(75) Inventors: Chung-Kuang Chen, Pan Chiao (TW); Han-Sung Chen, Hsinchu (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 398 days.

This patent is subject to a terminal disclaimer.

(21) Appl. No.: 13/474,270

(22) Filed: May 17, 2012

(65) Prior Publication Data

US 2012/0224443 A1    Sep. 6, 2012

Related U.S. Application Data

(63) Continuation of application No. 12/508,607, filed on Jul. 24, 2009, now Pat. No. 8,208,330.

(51) Int. Cl.
*G11C 7/02* (2006.01)
*G11C 7/06* (2006.01)

(52) U.S. Cl.
CPC . *G11C 7/062* (2013.01); *G11C 7/02* (2013.01)

(58) Field of Classification Search
CPC ................................. G11C 7/02; G11C 7/062
USPC ................ 365/207, 208, 210.1, 209, 210.11, 365/210.12, 210.13, 210.14
See application file for complete search history.

(56) References Cited

U.S. PATENT DOCUMENTS

| | | |
|---|---|---|
| 5,761,123 A | 6/1998 | Kim et al. |
| 6,018,486 A | 1/2000 | Ferrant |
| 6,185,143 B1 | 2/2001 | Perner et al. |
| 6,937,495 B2 | 8/2005 | Scheuerlein |
| 7,151,688 B2 | 12/2006 | Williford et al. |
| 7,327,621 B2 * | 2/2008 | Lin et al. ........................ 365/207 |

* cited by examiner

*Primary Examiner* — Vanthu Nguyen
(74) *Attorney, Agent, or Firm* — McClure, Qualey & Rodack, LLP

(57) ABSTRACT

A sense amplifier includes a first transistor, a second transistor, an output circuit, and a shielding circuit. The first transistor has a gate bias established by a cell current, and the second transistor has a gate bias established by a reference current. The output circuit is coupled to the first and the second transistor. The shielding circuit is located between the second transistor and the output circuit.

12 Claims, 6 Drawing Sheets

1

SENSE AMPLIFIER WITH SHIELDING CIRCUIT

This is a continuation application of application Ser. No. 12/508,607, filed Jul. 24, 2009, now U.S. Pat. No. 8,208,330, the disclosure of which is incorporated by reference herein in its entirety.

BACKGROUND OF THE INVENTION

1. Field of the Invention

The invention relates in general to a sense amplifier, and more particularly to a sense amplifier capable of reducing the feed through effect due to output signal sweeping on the reference node, which receives a reference voltage from a reference cell, of the sense amplifier.

2. Description of the Related Art

Non-volatile memory, such as flash memory, is widely used in various electronic products. Conventionally, when data stored in a memory cell of the flash is read, the memory cell is biased through a column decoder and a row decoder so that the memory cell generates a sensing current. For example, the sensing current is applied to a node for establishing a sense voltage. The sense voltage is compared with a reference voltage, which is established by a reference current provided by a reference cell, by a sense amplifier so that a sense result of the storage data can be determined.

Typically, the reference voltage is varied (or raised mostly) by the operation of the sense amplifier due to the feed through effect on an input stage circuit, which provides an internal reference current according to a reference voltage established by a reference current of the sense amplifier. What is even worse is that the reference voltage is shared by a number of sense amplifiers and the variation of the reference voltage caused by the feed through effect taking place in those sense amplifiers will be accumulated and sense results provided by those sense amplifiers will be wrongly determined. Thus, there is a prominent direction for this industry to design a sense amplifier capable of reducing the variation of the reference voltage and sensing the storage data correctly.

SUMMARY OF THE INVENTION

The invention is directed to a sense amplifier that employs a shielding circuit on an output node of a reference input stage circuit of the sense amplifier to effectively reduce variations in a reference voltage due to a feed through effect between the output node and an input node of the memory input stage circuit. The reference voltage on the input node is established by a reference current provided by a reference cell and is applied to the sense amplifier to generate a sense result corresponding to storage data stored in a read memory cell. Consequently, in comparison with the conventional sense amplifier, the sense amplifier according to the invention can effectively reduce the variations in the reference voltage and can sense the storage data stored in the memory cell correctly.

According to a first aspect of the present invention, a sense amplifier is provided. The sense amplifier includes a memory input stage circuit, a reference input stage circuit, and output stage circuit, and a shielding transistor. The memory input stage circuit receives a cell current, and the reference input stage circuit receives a reference current. The output stage circuit is coupled to the memory and the reference input stage circuits, and the output stage circuit has a latch, first and second transistors. The shielding transistor is electrically coupled with the reference input stage circuit and the output stage circuit.

According to a first aspect of the present invention, a sense amplifier is provided. The sense amplifier includes a first transistor, a second transistor, an output circuit, and a shielding circuit. The first transistor has a gate bias established by a cell current, and the second transistor has a gate bias established by a reference current. The output circuit is coupled to the first and the second transistor. The shielding circuit is located between the second transistor and the output circuit.

The invention will become apparent from the following detailed description of the preferred but non-limiting embodiments. The following description is made with reference to the accompanying drawings.

DETAILED DESCRIPTION OF THE INVENTION

The sense amplifier according to an embodiment of this invention applies a shielding circuit for reducing a reference voltage established by a reference cell from being changed severely.

Figure 1:
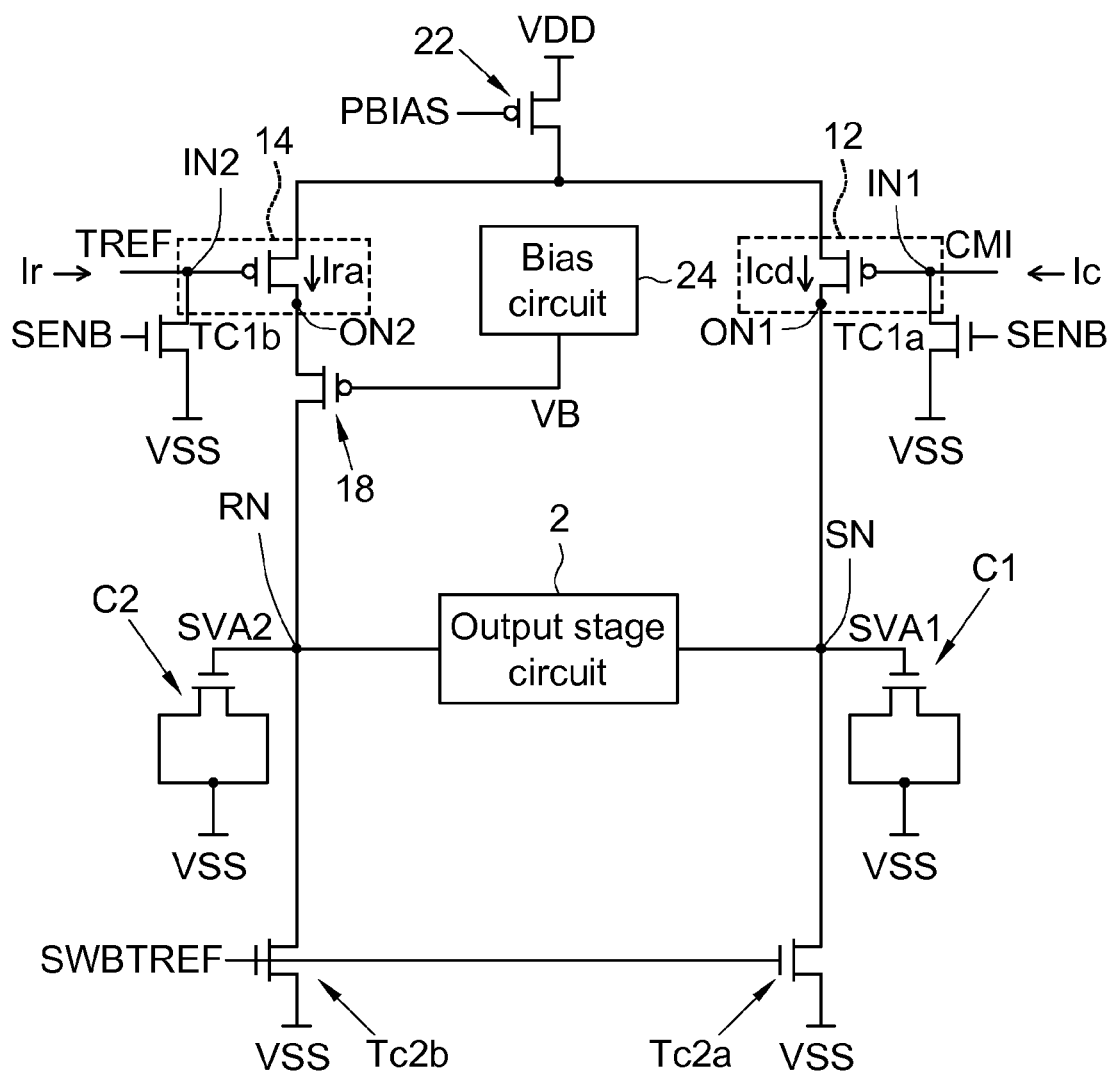
FIG. 1 illustrates a block diagram of the sense amplifier according to a first embodiment of the invention.

FIG. 1 shows a block diagram of the sense amplifier according to a first embodiment of this invention. The sense amplifier 1 is applied in a memory, which includes a memory array and a reference array (not shown). The sense amplifier 1 compares a cell current Ic provided by a memory cell of the memory array and a reference current Ir provided by the reference array, so as to sense a bit of data stored in the memory cell.

The sense amplifier 1 includes a sense node SN, a reference node RN, a memory input stage circuit 12, a reference input stage circuit 14, a first shielding circuit 18 and an output stage circuit 2.

The memory input stage circuit 12 includes a first input node IN1 and a first output node ON1. The first input node IN1 maintains a sense voltage CMI established by the cell current Ic. For example, the memory input stage circuit includes a P-type metal oxide semiconductor (PMOS) transistor having a gate (i.e. the first input node IN1) receiving the sense voltage CMI, a source coupled to a bias circuit 22, and a drain (i.e. the first output node ON1) coupled to the sense node SN. The memory input stage circuit 12 provides a cell current Icd to the sense node SN to establish a sense voltage SVA1 on the sense node SN in response to the first sense voltage CMI. For example, one end of a capacitor C1 is coupled to the sense node SN and the amplified cell current Icd is applied to charge the capacitor C1 to establish the sense voltage SVA1. The other end of the capacitor C1 receives a ground voltage VSS.

The reference input stage circuit 14 includes a second input node IN2 and a second output node ON2. The second input node IN2 maintains a reference voltage TREF established by the reference current Ir. For example, the reference input stage circuit 14 includes a PMOS transistor having a gate (i.e.

the second input node IN2) receiving the reference voltage TREF, a source coupled to the bias circuit 22, and a drain (i.e. the second output node ON2) coupled to the first shielding circuit 18. The reference input stage circuit 14 provides an amplified reference current Ira to the reference node RN to establish a reference voltage SVA2 on the reference node RN in response to the reference voltage TREF. For example, a capacitor C2 is coupled to the reference node RN and the amplified reference current Ira is applied to charge the capacitor C2 to establish the reference voltage SVA2. The other end of the capacitor C2 receives the ground voltage VSS.

The first shielding circuit 18 is provided between the reference node RN and the second output node ON2 for shielding the second output node ON2 from being interfered with the reference voltage SVA2 on the reference node RN. For example, the first shielding circuit 18 includes a PMOS transistor having a gate receiving a bias voltage VB, a source coupled to the second output node ON2, and a drain coupled to the reference node RN. The first shielding circuit 18 is turned on in response to the bias voltage VB to keep a situation status, so that the variations of the voltage at the second output Node ON2 can be reduced. As such, the feed through effect between the second output node ON2 and the second input node IN2 can be effectively reduced. Consequently, the variations in the reference voltage TREF due to the feed through effect can also be effectively reduced. The bias voltage VB is provided by a bias circuit 24.

The output stage circuit 2 obtains a sense result SO in response to the reference voltage SVA2 and the sense voltage SVA1. Thus, the sense result of the memory cell can be effectively obtained.

Figure 2:
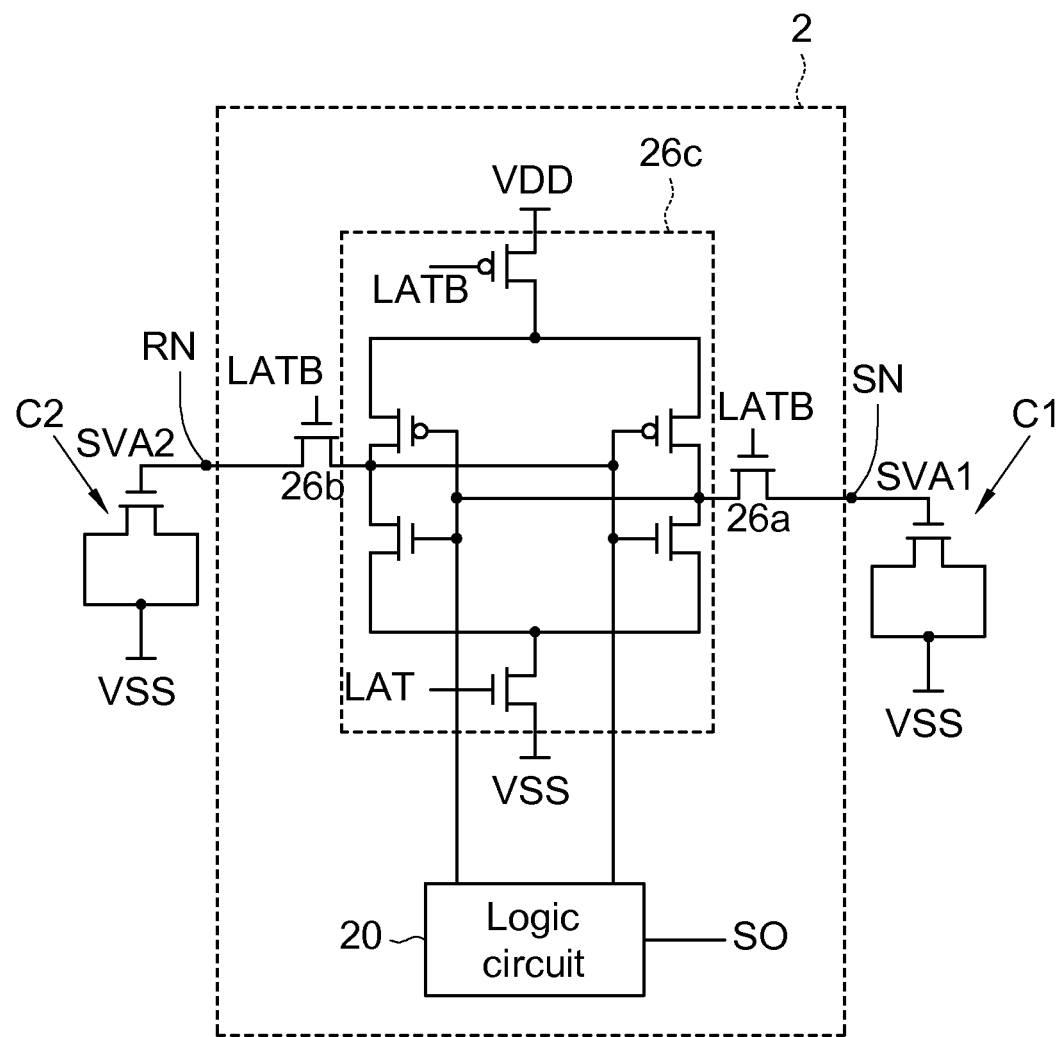
FIG. 2 illustrates a detailed block diagram of the output stage circuit 2 shown in FIG. 1.

FIG. 2 shows a detailed block diagram of the output stage circuit 2 shown in FIG. 1. In an example, the output stage circuit 2 incorporates pass gates 26a, 26b, an amplifying stage circuit, and a logic circuit 20. The pass gates 26a and 26b respectively provide the sense voltage SVA1 and the reference voltage SVA2 to the amplifying stage circuit in response to a control signal LATB. For example, the amplifying stage circuit includes a latch circuit 26c for amplifying a voltage difference VD between the sense voltage SVA1 and the reference voltage SVA2 to obtain an amplified voltage difference VDA. For example, the latch circuit 26c is enabled by a high voltage level of a control signal LAT and a low voltage level of the control signal LATB. The control signal LATB is the inverted signal of the control signal LAT. The logic circuit 20 generates the sense result SO in response to the amplified voltage difference VDA.

Figure 3:
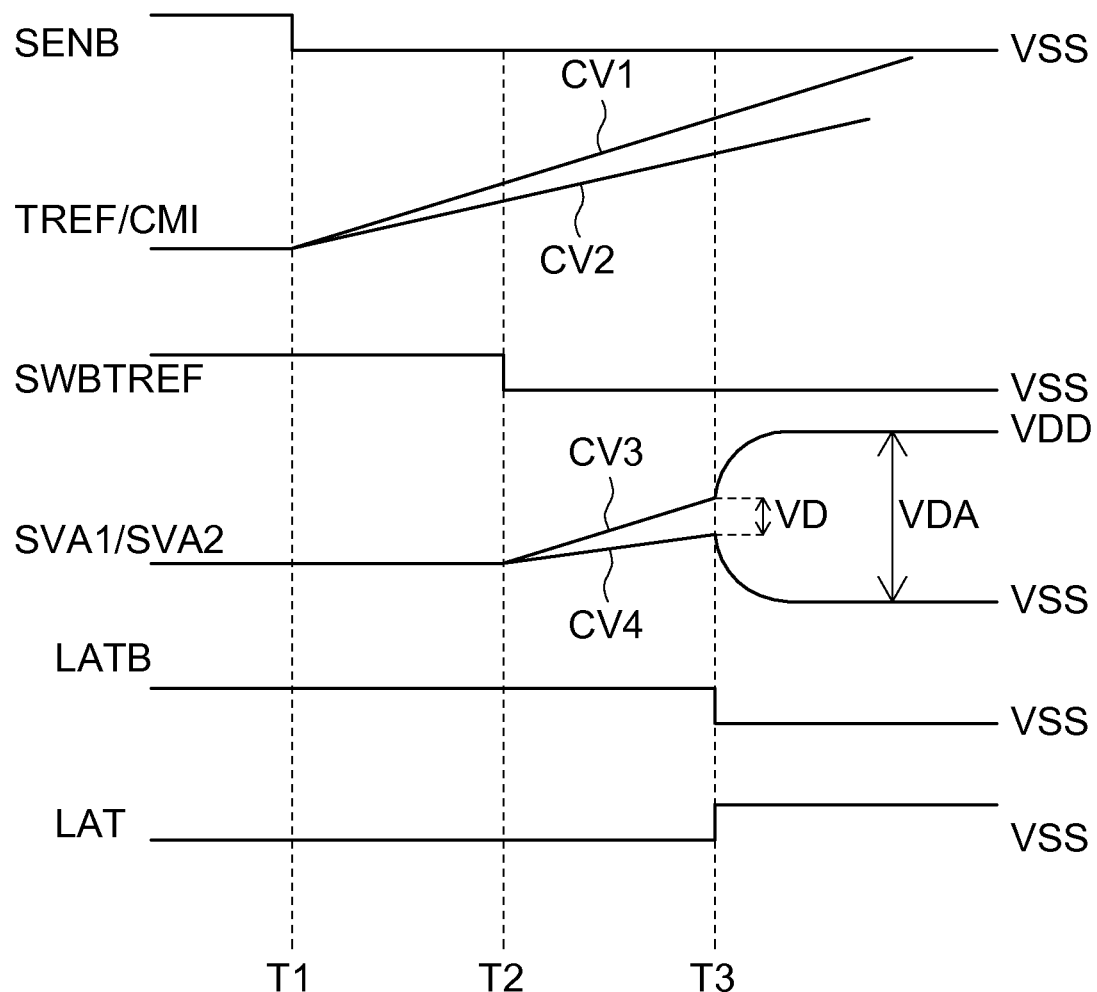
FIG. 3 illustrates a timing diagram of the related signals of the sense amplifier 1 shown in FIG. 1.

FIG. 3 shows a timing diagram of the related signals of the sense amplifier 1 shown in FIG. 1. For example, the sense amplifier 1 further includes timing controllers TC1a, TC1b, TC2a, and TC2b for managing the operation of the sense amplifier 1.

The timing controllers TC1a and TC1b enable circuit paths respectively pulling the level of the sense voltage CMI and the reference voltage TREF down to the ground voltage VSS before a time spot T1 and disable them after the time spot T1. Thus, the sense voltage CMI and the reference voltage TREF, which are respectively charged by the cell current Ic and the reference current Ir, rise from the ground voltage VSS with different grades after the time spot T1. For example, in FIG. 3, curves CV1 and CV2 indicate the level of the sense voltage CMI and the reference voltage TREF, respectively. For example, each of the timing controllers TC1a and TC1b includes an N-type MOS (NMOS) transistor, which turns on before the time spot T1 and turns off after the time spot T1 in response to a timing signal SENB. The timing signal SENB has a falling edge triggered at the time spot T1.

The timing controllers TC2a and TC2b enable circuit paths respectively to pull the level of the sense voltage SVA1 and the reference voltage SVA2 down to the ground voltage VSS before a time spot T2, and disable them after the time spot T2. Thus, the sense voltage SVA1 and the reference voltage SVA2, which are respectively charged by the amplified cell current Icd and the amplified reference current Ira, rise from the ground voltage VSS with different slopes after the time spot T2. For example, in FIG. 3, the level of the sense voltage SVA1 is indicated by the curve CV3 and the level of the reference voltage SVA2 is indicated by the curve CV4. For example, each of the timing controllers TC2a and TC2b includes an NMOS transistor, which turns on before the time spot T2 and turns off after the time spot T2 in response to a timing signal SWBTREF. The timing signal SWBTREF has a falling edge triggered at the time spot T2.

Before a time spot T3, the control signals LAT and LATB respectively have the low voltage level and the high voltage level. Thus, the latch circuit 26c is disabled and the pass gates 26a and 26b are turned on. After the time spot T3, the control signal LAT goes from a low voltage level to a high voltage level and the inverted control signal LATB goes from a high voltage level to a low voltage level. Thus, the pass gates 26a and 26b are turned off and the latch circuit 26c is enabled to amplify the voltage difference VD to obtain an amplified voltage difference VDA.

Figure 4:
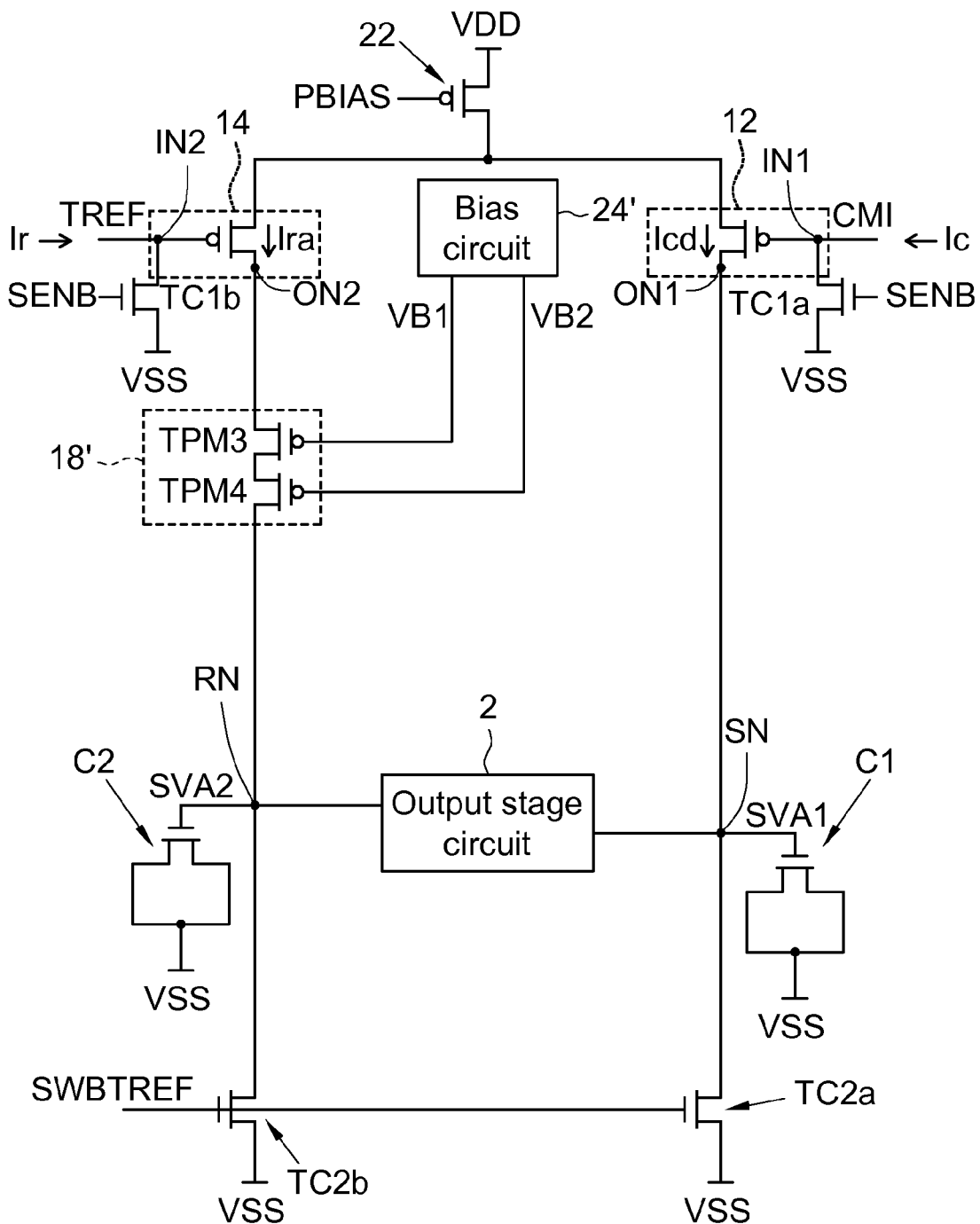
FIG. 4 illustrates a block diagram of the sense amplifier according to a second embodiment of the invention.

In the above embodiment, the first shielding circuit 18 includes a PMOS transistor. However, the first shielding circuit 18 is not limited thereto. In other embodiments, a first shielding circuit can include two or more than two transistors. For example, in FIG. 4, the first shielding circuit 18' includes PMOS transistors TPM3 and TPM4. The bias circuit 24' applied in the sense amplifier 1' provides a bias voltage VB1 to turn on the PMOS transistor TPM3 and provides a bias voltage VB2 to turn on the PMOS transistor TPM4. It can be obtained that the first shielding circuit 18' can perform the operation similar to that of the first shielding circuit 18.

Figure 5:
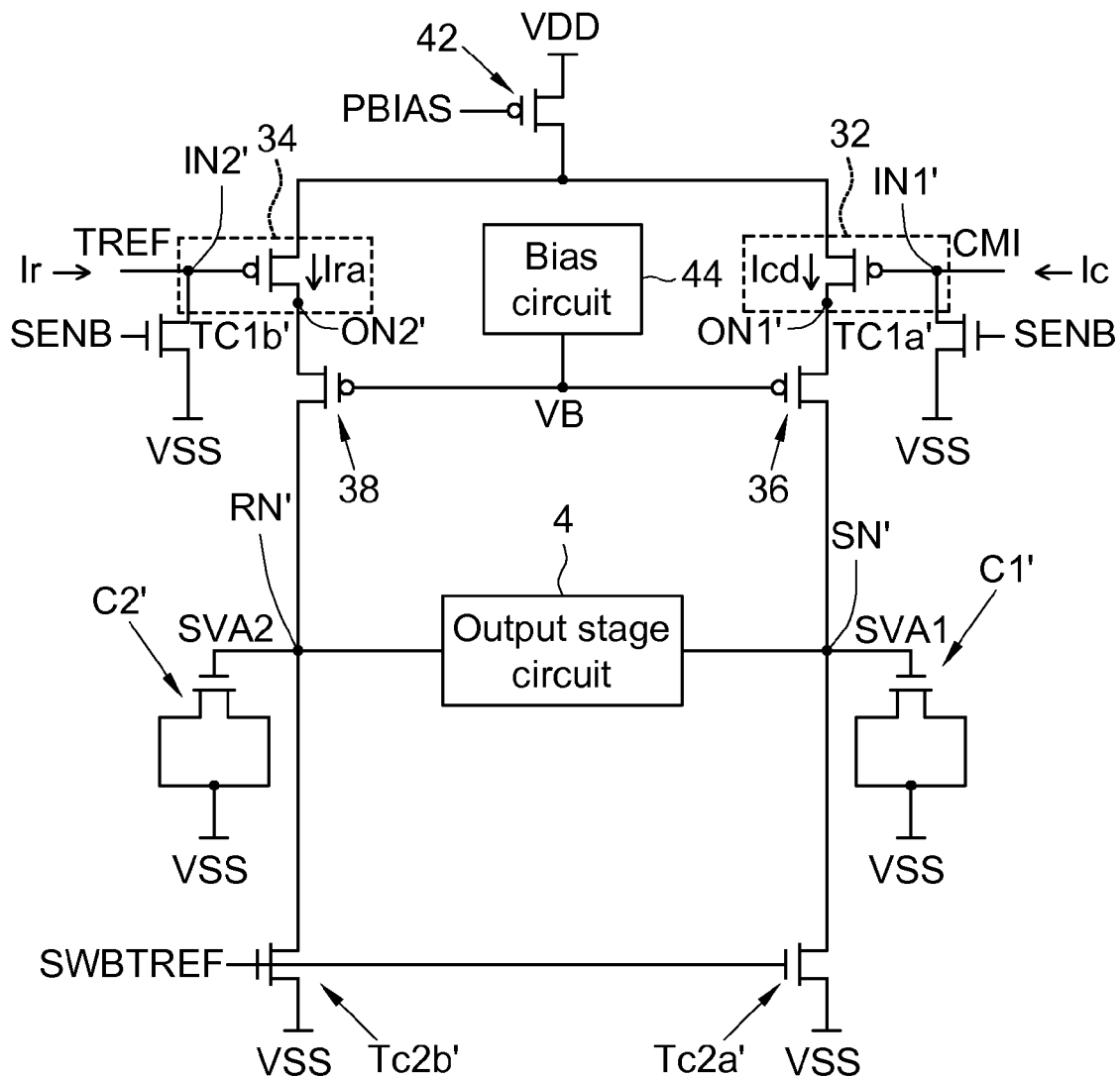
FIG. 5 illustrates a block diagram of the sense amplifier according to a third embodiment of the invention.

In the above embodiment, a first shielding circuit is incorporated in the sense amplifier to reduce the variations on the reference voltage TREF due to the feed through effect taking place on the reference input stage circuit 14. However, the sense amplifier according to the present embodiment of this invention is not limited thereto. In other example, second shielding circuits 36 and 36' can also be employed to reduce the feed through effect taking place on the memory input stage circuit, as shown in FIGS. 5-6.

A second shielding circuit 36 is provided between the sense node SN' and the first output node ON1' for shielding the first output node ON1' from being interfered with the sense voltage SVA1 on the sense node SN'. For example, the second shielding circuit 36 includes a PMOS transistor having a gate receiving the bias voltage VB, a source coupled to the first output node ON1', and a drain coupled to the sense node SN', as shown in FIG. 5.

The PMOS transistor in the second shielding circuit 36 is turned on in response to the bias voltage VB to substantially reducing variations in the voltage at the first output node ON1'. As such, the feed through effect between the first output node ON1' and the first input node IN1' can be effectively reduced. Consequently, the variations in the sense voltage CMI due to the feed through effect can also be effectively reduced.

Figure 6:
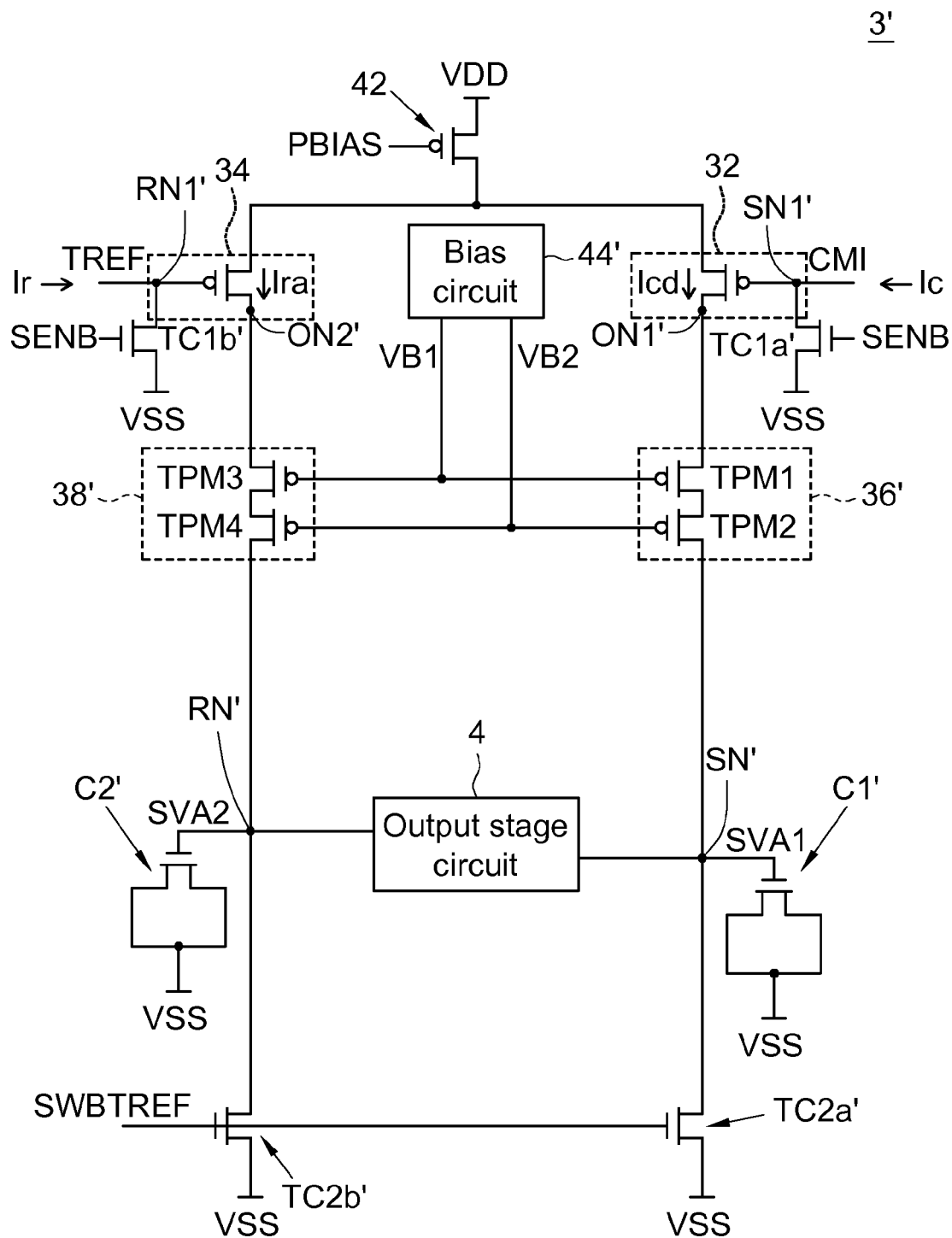
FIG. 6 illustrates a block diagram of the sense amplifier according to a fourth embodiment of the invention.

In other example, the second shielding circuit can also include two PMOS transistors TPM1 and TPM2, which are serially connected between the first output node ON1' and the sense node SN', as shown in FIG. 6.

The sense amplifier according to the embodiment of this invention employs a first shielding circuit on an output node of a reference input stage circuit to reduce variations in the voltage at an output node of the reference input stage circuit to reduce the feed through effect between the output node and the input node of the reference input stage circuit. A reference voltage on the input node of the reference input stage circuit is established by a reference current provided by a reference cell. The reference voltage is applied to the sense amplifier to generate a sense result corresponding to storage data stored in a read memory cell. Consequently, in comparison with the conventional sense amplifier, the sense amplifier according to the invention can effectively reduce the variations in the reference voltage and can sense the storage data stored in the memory cell correctly.

Besides, the sense amplifier according to the embodiment of this invention further employs a second shielding circuit on an output node of a memory input stage circuit to reduce variations in the voltage at an output node of the memory input stage circuit to reduce the feed through effect between the output node and the input node of the memory input stage circuit. A sense voltage on the input node of the memory input stage circuit is established by a sense current provided by the read memory cell. The sense voltage is sensed by the sense amplifier to generate the sense result corresponding to the storage data. Consequently, in comparison with the conventional sense amplifier, the sense amplifier according to the invention can effectively reduce the variations in the sense voltage and can sense the storage data stored in the memory cell correctly.

While the invention has been described by way of examples and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A sense amplifier, comprising:
    a memory input stage circuit for receiving a cell current;
    a reference input stage circuit for receiving a reference current;
    an output stage circuit coupled to the memory and the reference input stage circuits, the output stage circuit having a latch, first and second transistors; and
    a shielding transistor unit electrically coupled with the reference input stage circuit and the output stage circuit;
    wherein the reference input stage circuit is controlled by the reference current for generating another reference current which flows through the shielding transistor unit;
    the reference input stage circuit comprises:
    a reference node; and
    a reference transistor, having a control node receiving a first reference voltage established by the reference current, an input node coupled to a power node, and an output node for outputting a second reference voltage to the reference node in response to the first reference voltage; and
    the shielding transistor unit comprises:
    a first shielding transistor, comprising a control end receiving a first bias voltage, a first output end coupled to the reference input stage circuit, and a second output end; and
    a second shielding transistor, comprising a control end receiving a second bias voltage, a first output end coupled to the second output end of the first shielding transistor, and a second output end coupled the reference input stage circuit.

2. The sense amplifier according to claim 1, wherein the memory input stage circuit comprises:
    a sense node; and
    a sense transistor, having a control node receiving a first sense voltage established by the cell current, an input node coupled to a power node, and an output node for outputting a second sense voltage to the sense node in response to the first sense voltage.

3. The sense amplifier according to claim 1, wherein the shielding transistor unit is provided between the output node and the reference node for shielding the output node from the reference node.

4. The sense amplifier according to claim 1, wherein the memory input stage circuit provides a sense voltage in response to the cell current, the reference input stage circuit provides a reference voltage in response to the reference current, and the output stage circuit obtains a sense result in response to the reference voltage and the sense voltage.

5. The sense amplifier according to claim 4, wherein the output stage circuit comprises:
    an amplifying stage circuit, for amplifying a voltage difference between a sense voltage, established in response to the cell current, and a reference voltage, established in response to the reference current, to obtain an amplified voltage difference.

6. The sense amplifier according to claim 5, wherein the output stage circuit comprises:
    a logic circuit, for generating the sense result in response to the amplified voltage difference.

7. A sense amplifier, comprising:
    a first transistor having a gate bias established by a cell current;
    a second transistor having a gate bias established by a reference current;
    an output circuit coupled to the first and the second transistor; and
    a shielding circuit located between the second transistor and the output circuit;
    wherein the second transistor is controlled by the reference current for generating another reference current which flows through the shielding circuit, the second transistor has a control node receiving a first reference voltage established by the reference current, an input node coupled to a power node, and an output node for outputting a second reference voltage to the reference node in response to the first reference voltage; and
    the shielding circuit comprises:
    a first shielding transistor, comprising a control end receiving a first bias voltage, a first output end coupled to the second transistor, and a second output end; and
    a second shielding transistor, comprising a control end receiving a second bias voltage, a first output end coupled to the second output end of the first shielding transistor, and a second output end coupled a reference node.

8. The sense amplifier according to claim 7, further comprising:
    a sense node, wherein,
    the first transistor has a control node receiving a first sense voltage established by the cell current, an input node coupled to a power node, and an output node for outputting a second sense voltage to the sense node in response to the first sense voltage.

9. The sense amplifier according to claim 7, wherein the shielding circuit is provided between the output node and the reference node for shielding the output node from the reference node.

10. The sense amplifier according to claim 7, wherein the first transistor provides a sense voltage in response to the cell current, the second transistor provides a reference voltage in response to the reference current, and the output circuit obtains a sense result in response to the reference voltage and the sense voltage.

11. The sense amplifier according to claim 10, wherein the output circuit comprises:
    an amplifying stage circuit, for amplifying a voltage difference between a sense voltage, established in response to the cell current, and a reference voltage, established in response to the reference current, to obtain an amplified voltage difference.

12. The sense amplifier according to claim 11, wherein the output circuit comprises:
    a logic circuit, for generating the sense result in response to the amplified voltage difference.

\* \* \* \* \*